US012751239B2

(12) United States Patent
Choi et al.

(10) Patent No.: US 12,751,239 B2
(45) Date of Patent: Sep. 29, 2026

(54) APPARATUS AND METHOD FOR DISPENSING TREATMENT LIQUID

(71) Applicant: SEMES CO., LTD., Cheonan-si (KR)

(72) Inventors: Kwang Jun Choi, Cheonan-si (KR); Jun Woo Lee, Cheonan-si (KR); Boyeon Hwang, Cheonan-si (KR); Gyeong Seok Hwang, Anyang-si (KR); Nayoon Jeoung, Cheonan-si (KR); Sungkeun Byun, Yongin-si (KR)

(73) Assignee: Semes Co., LTD., Cheonan-si (KR)

( * ) Notice: Subject to any disclaimer, the term of this patent is extended or adjusted under 35 U.S.C. 154(b) by 541 days.

(21) Appl. No.: 18/302,303

(22) Filed: Apr. 18, 2023

(65) Prior Publication Data

US 2023/0352325 A1 Nov. 2, 2023

(30) Foreign Application Priority Data

May 2, 2022 (KR) ........................ 10-2022-0054247

(51) Int. Cl.
*B41J 11/00* (2006.01)
*B41J 2/045* (2006.01)
(Continued)

(52) U.S. Cl.
CPC ...... *H10P 72/0448* (2026.01); *B41J 2/04501* (2013.01); *B41J 2/07* (2013.01);
(Continued)

(58) Field of Classification Search
CPC .. H10P 72/0448; H10P 70/15; H10P 72/0414; H10P 72/0606; H10P 72/0612;
(Continued)

(56) References Cited

U.S. PATENT DOCUMENTS

2009/0167817 A1 7/2009 Orr
2019/0378768 A1 12/2019 Toriumi
2022/0072848 A1 3/2022 Kim et al.

FOREIGN PATENT DOCUMENTS

CN 104136917 A 11/2014
CN 108471838 A 8/2018
(Continued)

OTHER PUBLICATIONS

Chinese Office Action dated Jul. 13, 2026 issued in corresponding Chinese Patent Application No. 202310405910.7 and English translation thereof.

*Primary Examiner* — Henok D Legesse
(74) *Attorney, Agent, or Firm* — Harness, Dickey & Pierce, P.L.C.

(57) ABSTRACT

An apparatus and method for dispensing treatment liquid, which enable treatment liquid to be accurately dispensed to an intended position on a substrate having a non-planar surface on the basis of measurement information obtained by three-dimensionally measuring the substrate. The apparatus may include: a substrate support unit on which a substrate is seated; a three-dimensional (3D) measurement device configured to three-dimensionally measure the substrate seated on the substrate support unit; a head unit configured to dispense treatment liquid onto the substrate seated on the substrate support unit; and a controller configured to receive actually measured 3D substrate information of the substrate from the 3D measurement device, generate printing pattern image information based on the actually measured 3D substrate information, and apply printing command information to the head unit according to the generated printing pattern image information.

20 Claims, 11 Drawing Sheets

(51) Int. Cl.

| | |
|---|---|
| ***B41J 2/07*** | (2006.01) |
| ***B41J 2/175*** | (2006.01) |
| ***B41J 2/21*** | (2006.01) |
| ***B41J 3/407*** | (2006.01) |
| ***G02F 1/13*** | (2006.01) |
| ***H10P 70/00*** | (2026.01) |
| ***H10P 72/00*** | (2026.01) |
| *G02F 1/1335* | (2006.01) |

(52) U.S. Cl.
CPC ........... *B41J 2/175* (2013.01); *B41J 2/17566* (2013.01); *B41J 2/21* (2013.01); *B41J 2/2132* (2013.01); *B41J 3/4073* (2013.01); *B41J 11/008* (2013.01); *G02F 1/1303* (2013.01); *H10P 70/15* (2026.01); *H10P 72/0414* (2026.01); *H10P 72/0606* (2026.01); *H10P 72/0612* (2026.01); *G02F 1/133516* (2013.01)

(58) Field of Classification Search
CPC .... B41J 11/008; B41J 3/4073; B41J 2/04501; B41J 2/175; B41J 2/17566; B41J 2/21; B41J 2/2132; B41J 2/07; G02F 1/133516; G02F 1/1303
See application file for complete search history.

(56) References Cited

FOREIGN PATENT DOCUMENTS

| | | | | | |
|---|---|---|---|---|---|
| CN | 110596957 | A | | 12/2019 | |
| EP | 0974468 | A2 | | 1/2000 | |
| JP | 2011068055 | A | | 4/2011 | |
| JP | 5713683 | B2 | | 5/2015 | |
| KR | 10-2008-0061776 | A | | 7/2008 | |
| KR | 101818695 | B1 | | 1/2018 | |
| KR | 102045763 | B1 | | 11/2019 | |
| KR | 10-2021-0006223 | A | | 1/2021 | |
| KR | 20210044431 | A | * | 4/2021 | ............. B41J 29/38 |
| KR | 20210063535 | A | | 6/2021 | |

* cited by examiner

APPARATUS AND METHOD FOR DISPENSING TREATMENT LIQUID

CROSS-REFERENCE TO RELATED APPLICATION(S)

This application claims the benefit under 35 USC § 119(a) of Korean Patent Application No. 10-2022-0054247, filed on May 2, 2022, in the Korean Intellectual Property Office, the entire disclosure of which is incorporated herein by reference for all purposes.

BACKGROUND

1. Field

The following description relates to an apparatus and method for dispensing treatment liquid, and more specifically, to an apparatus and method for dispensing treatment liquid, which enable treatment liquid to be accurately dispensed to an intended position on a substrate having a non-planar surface on the basis of measurement information obtained by three-dimensionally measuring the substrate.

2. Description of Related Art

Generally, display devices, which are electro-optical devices, such as liquid crystal devices and electroluminescence devices, are widely used in display sections of electronic devices, such as cellular phones, portable computers, smart pads, televisions, and the like. In addition, such display devices often provide a full-color display.

Full color display by a liquid crystal device may be achieved by passing light which is modulated by a liquid crystal layer through a color filter. The color filter is formed by disposing color filter elements in a dot form, such as color filters of R (red), G (green), and B (blue), on a surface of a base board which is made from a glass member or a plastic member in a predetermined disposition method such as stripe-disposition, delta-disposition, and mosaic disposition.

Conventionally, it has been known that photolithography methods may be used for patterning filter elements of various colors, such as R, G, and B, of the color filters. However, there are problems in that manufacturing processes of the photolithography method are complicated and a large quantity of coloring materials or photoresist is consumed; thus, manufacturing cost increases.

In order to solve these problems, an inkjet printing method is proposed for forming filter elements in a dot array form by dispensing a material (ink) of the filter elements in a dot form by an inkjet method of ejecting droplets onto a substrate, such as a glass substrate, or the like.

In particular, the market for inkjet-type treatment liquid dispensing devices is one of the emerging key technology-based markets, surpassing the concept of production by vacuum deposition and becoming a critical core technology in the high-value added display industry, where production is possible in ambient air at room temperature.

SUMMARY

However, the aforementioned treatment liquid dispensing devices have to dispense treatment liquid onto substrates with non-planar surfaces having complex three-dimensional patterns formed by a complicated structure of an underlying film of the substrate that makes it difficult to know the flatness of the underlying film formed through a previous process, the depth or shape of structures, rather than substrates with flat surfaces, i.e., flat substrates without underlying structures. As a result, executing a printing command based on a flat image of a printing pattern in the form of a simple CAD results in the difference in position of ink impact points due to height variations in the substrate, causing printing defects, such as abnormal printing results, variations in the width of the pattern or amount of coating, for example.

In order to prevent printing defects due to such existing three-dimensional (3D) surface characteristics, attempts have been made such as correcting a flat image of a printing pattern by operators highly trained or skilled in using CAD programs proficiently. However, in this case, printing defects cannot be fundamentally prevented due to poor reliability and uniformity or the work, and in the case of complicated structures, image correction is impossible.

The present invention is provided to solve various problems including the aforementioned issues, and aims to provide an apparatus and method for dispensing treatment liquid, which can prevent printing defects by receiving actually measured 3D substrate information of a substrate for accurately identifying the flatness of an underlying film, a depth and shape of a structure, etc. from a 3D measurement device capable of actually measuring the substrate, generating printing pattern image information based on the actually measured 3D substrate information, and applying highly accurate and precise printing command information to a head unit according to the generated printing pattern image information. However, these objects are merely illustrative, and the scope of the present invention is not limited thereto.

According to the present inventive concept, an apparatus for dispensing treatment liquid may include: a substrate support unit on which a substrate is seated; a 3D measurement device configured to three-dimensionally measure the substrate seated on the substrate support unit; a head unit configured to dispense treatment liquid onto the substrate seated on the substrate support unit; and a controller configured to receive actually measured 3D substrate information of the substrate from the 3D measurement device, generate printing pattern image information based on the actually measured 3D substrate information, and apply printing command information to the head unit according to the generated printing pattern image information.

Also, according to the present invention, the 3D measurement device may an optical measurement device which emits a first incident light to a first portion having a first height, formed on the substrate, and analyzes characteristics of a first reflected light produced at the first portion to obtain actually measured 3D substrate information of the first portion and emits a second incident light to a second portion having a second height different from the first height, formed on the substrate, and analyzes characteristics of a second reflected light produced at the second portion to obtain the actually measured 3D substrate information of the second portion.

In addition, according to the present invention, the controller may adjust a first partial printing portion of the printing pattern image information that corresponds to the first portion to a first dispensing amount according to the first height and may adjust a second partial printing portion of the printing pattern image information that corresponds to the second portion to a second dispensing amount according to the second height.

Also, according to the present invention, the controller may adjust the first partial printing portion of the printing pattern image information that corresponds to the first portion to a first width according to the first height and may adjust the second partial printing portion of the printing pattern image information that corresponds to the second portion to a second width according to the second height.

Moreover, according to the present invention, the controller may adjust the first partial printing portion of the printing pattern image information that corresponds to the first portion to a first head movement speed according to the first height and may adjust the second partial printing portion of the printing pattern image information that corresponds to the second portion to a second head movement speed according to the second height.

In addition, according to the present invention, the 3D measurement device may be a bar-type scanning device having a bar-type light emitting part and a bar-type light-receiving part.

Also, according to the present invention, the 3D measurement device may be fixed to the head unit or fixed in the vicinity of the head unit and may move along with the head unit.

Moreover, according to the present invention, the controller may apply a measurement control signal to the 3D measurement device to enable the 3D measurement device to measure the substrate on which printing has been performed, may receive 3D printing result information of the substrate from the 3D measurement device, and may determine whether a printed state is normal or abnormal based on the 3D printing result information.

In addition, according to the present invention, the controller may apply a measurement control signal to the 3D measurement device to enable the 3D measurement device to measure the substrate on which printing has been performed, may receive 3D printing result information of the substrate from the 3D measurement device, and may generate printing pattern correction information by correcting the printing pattern image information based on the 3D printing result information.

Furthermore, according to the present invention, the apparatus may further include a first moving unit configured to move the head unit and the 3D measurement device in a first direction; and a second moving unit configured to move the head unit and the 3D measurement device in a second direction.

According to the present invention concept, a method of dispensing treatment liquid may include: (a) seating a substrate on a substrate support unit; (b) three-dimensionally measuring, by a 3D measurement device, the substrate seated on the substrate support unit; (c) receiving, at a controller, actually measured 3D substrate information of the substrate from the 3D measurement device, generating printing pattern image information based on the actually measured 3D substrate information, and applying printing command information to a head unit according to the generated printing pattern image information; and (d) dispensing, at the head unit, treatment liquid onto the substrate according to the printing command information.

In addition, according to the present invention, in operation (c), the controller may adjust a first partial printing portion of the printing pattern image information that corresponds to a first portion to a first dispensing amount according to a first height and may adjust a second partial printing portion of the printing pattern image information that corresponds to a second portion to a second dispensing amount according to a second height.

In addition, according to the present invention, in operation (c), the controller may adjust a first partial printing portion of the printing pattern image information that corresponds to a first portion to a first width according to a first height and may adjust a second partial printing portion of the printing pattern image information that corresponds to a second portion to a second width according to a second height.

In addition, according to the present invention, in operation (c), the controller may adjust the first partial printing portion of the printing pattern image information that corresponds to a first portion to a first head movement speed according to a first height and may adjust a second partial printing portion of the printing pattern image information that corresponds to a second portion to a second head movement speed according to a second height.

Further, according to the present invention, the method may further include, after operation (d), (e) measuring, by the 3D measurement device, the substrate on which printing has been performed.

In addition, according to the present invention, the method may further include, after operation (e), (f) receiving, at the controller, 3D printing result information of the substrate from the 3D measurement device and determining whether a printed state is normal or abnormal based on the 3D printing result information.

Moreover, according to the present invention, the method may further include, after operation (e), (g) receiving, at the controller, 3D printing result information of the substrate from the 3D measurement device and generating printing pattern correction information by correcting the printing pattern image information based on the 3D printing result information; and (h) dispensing, at the head unit, the treatment liquid onto a new substrate according to the printing pattern correction information.

Also, according to the present invention, in operation (b), a first moving unit may move the head unit in a first direction and a second moving unit may move the head unit in a second direction.

Furthermore, according to the present invention, in operation (d), the first moving unit may move the 3D measurement device in the first direction and the second moving unit may move the 3D measurement device in the second direction.

According to the present inventive concept, an apparatus for dispensing treatment liquid may include: a substrate support unit on which a substrate is seated; a 3D measurement device configured to three-dimensionally measure the substrate seated on the substrate support unit; a head unit configured to dispense treatment liquid onto the substrate seated on the substrate support unit; a first moving unit configured to move the head unit and the 3D measurement device in a first direction; a second moving unit configured to move the head unit and the 3D measurement device in a second direction; and a controller configured to receive actually measured 3D substrate information of the substrate from the 3D measurement device, generate printing pattern image information based on the actually measured 3D substrate information, and apply printing command information to the head unit according to the generated printing pattern image information, wherein the 3D measurement device may be an optical measurement device which emits a first incident light to a first portion having a first height, formed on the substrate, and analyzes characteristics of a first reflected light produced at the first portion to obtain actually measured 3D substrate information of the first portion and emits a second incident light to a second portion having a second height different from the first height, formed on the substrate, and analyzes characteristics of a second reflected light produced at the second portion to obtain the actually measured 3D substrate information of the second portion.

Other features and aspects will be apparent from the following detailed description, the drawings, and the claims.

Figure 1:
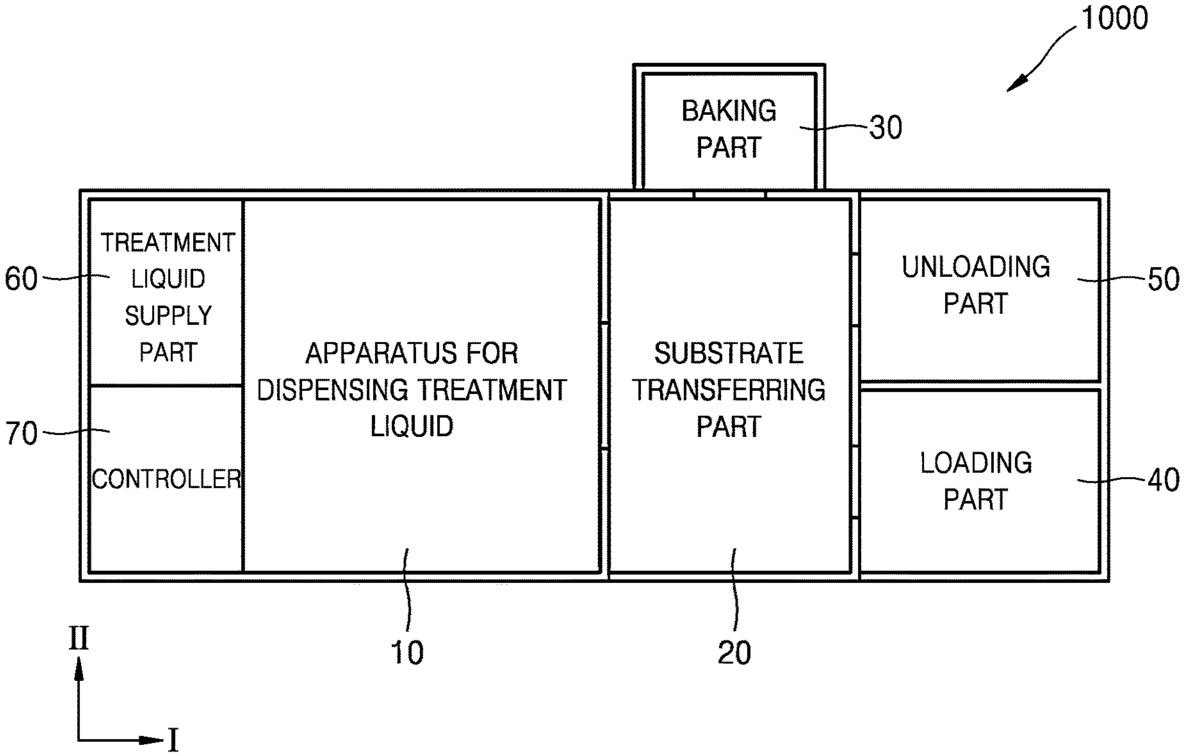
FIG. 1 is a plane configuration view showing a treatment liquid application facility in which an apparatus for dispensing treatment liquid is installed according to some embodiments of the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Hereinafter, various preferred embodiments of the present invention will be described in detail with reference to the accompanying drawings.

The embodiments of the present invention are provided for more fully describing the present invention to those skilled in the art, and the embodiments below may be modified in various forms, and the scope of the present invention is not limited to the embodiments below. Rather, these embodiments are provided such that this disclosure will be thorough and complete and will fully convey the spirit of the present invention to those skilled in the art. Also, thickness or sizes of layers in the drawings are exaggerated for convenience of explanation and clarity.

Terms used in the present specification are used for explaining a specific embodiment, not for limiting the present invention. Thus, the expression of singularity in the present specification includes the expression of plurality unless clearly specified otherwise in context. Also, terms such as "comprise" and/or "comprising" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Hereinafter, the embodiments of the present invention are described in detail with reference to the accompanying drawings. In the drawings, the illustrated shapes may be modified according to, for example, manufacturing technology and/or tolerance. Thus, the embodiment of the present invention may not be construed to be limited to a particular shape of a part described in the present specification and may include a change in the shape generated during manufacturing, for example.

FIG. 1 is a plane configuration view showing a treatment liquid application facility 1000 in which an apparatus 10 for dispensing treatment liquid is installed according to some embodiments of the present invention.

As shown in FIG. 1, the treatment liquid application facility 1000 may apply treatment liquid onto a target object by an inkjet method. For example, the target object may be a glass substrate, a silicon substrate, a display substrate, or a color filter substrate of a liquid crystal display panel, and the treatment liquid may be red (R), green (G), and blue (B) inks in which pigments are mixed with a solvent. The ink may be applied to an inner region of a black matrix arranged in a lattice pattern on a color filter substrate.

The treatment liquid application facility 1000 includes the apparatus 10 for dispensing treatment liquid, a substrate transferring part 20, a baking part 30, a loading part 40, an unloading part 50, a treatment liquid supply part 60, and a controller 70. The apparatus 10 for dispensing treatment liquid and the substrate transferring part 20 may be arranged in a line in a first direction I and positioned adjacent to each other. The treatment liquid supply part 60 and the controller 70 may be disposed at positions facing the substrate transferring part 20 with respect to the apparatus 10 for dispensing treatment liquid, and the treatment liquid supply part 60 and the controller 70 may be arranged in a line in a second direction II.

The loading part 40 and the unloading part 50 may be disposed at positions facing the apparatus 10 for dispensing treatment liquid with respect to the substrate transferring part 20, and the loading part 40 and the unloading part 50 may be arranged in a line in the second direction II. In addition, the baking part 30 may be disposed adjacent to one side of the substrate transferring part 20.

Here, the first direction (I) is a direction in which the apparatus 10 for dispensing treatment liquid and the substrate transferring part 20 are arranged, the second direction II is a direction perpendicular to the first direction I on a horizontal plane, and a third direction III is a direction perpendicular to the second direction II.

A substrate to which treatment liquid (ink) is to be applied may be introduced into the loading part 40. The substrate transferring part 40 may transfer the substrate introduced into the loading part 40 to the apparatus 10 for dispensing treatment liquid. The apparatus 10 for dispensing treatment liquid may be supplied with treatment liquid from the treatment liquid supply part 60 and dispense the treatment liquid onto the substrate by an inkjet method. The substrate transferring part 20 may transfer the substrate from the apparatus 10 for dispensing treatment liquid to the baking part 30. The baking part 30 may heat the substrate to evaporate a liquid substance (solvent) other than solid components of the treatment liquid (ink) dispensed onto the substrate.

The substrate transferring part 20 may transfer the substrate from the baking part 30 to the unloading part 50. The substrate to which the treatment liquid is applied may be taken out from the unloading part 50. The controller 70 may control the overall operations of the apparatus 10 for dispensing treatment liquid, the substrate transferring part 20, the baking part 30, the loading part 40, the unloading part 50, and the treatment liquid supply part 60.

Figure 2:
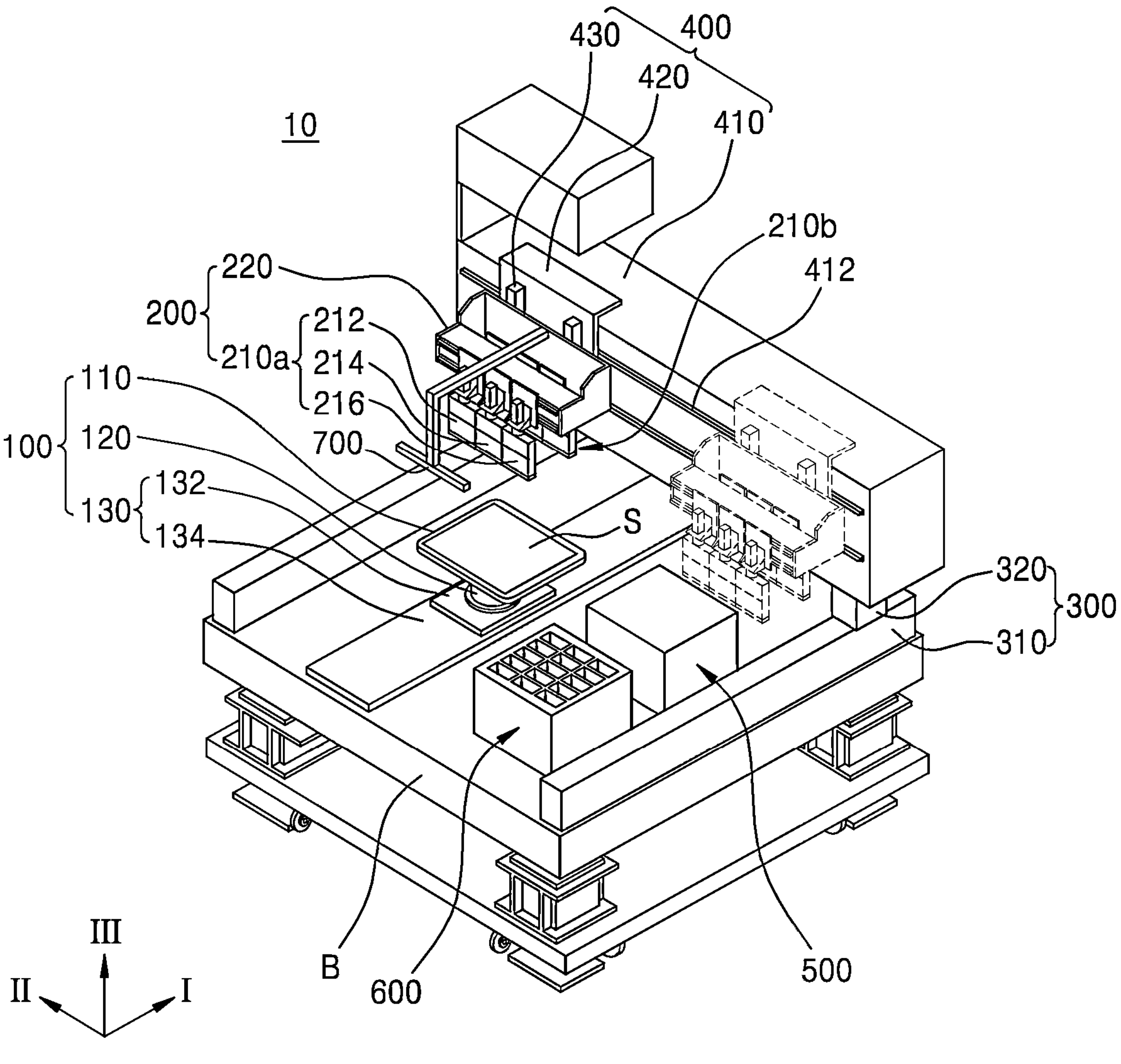
FIG. 2 is a perspective view showing the apparatus for dispensing treatment liquid of FIG. 1.
Figure 3:
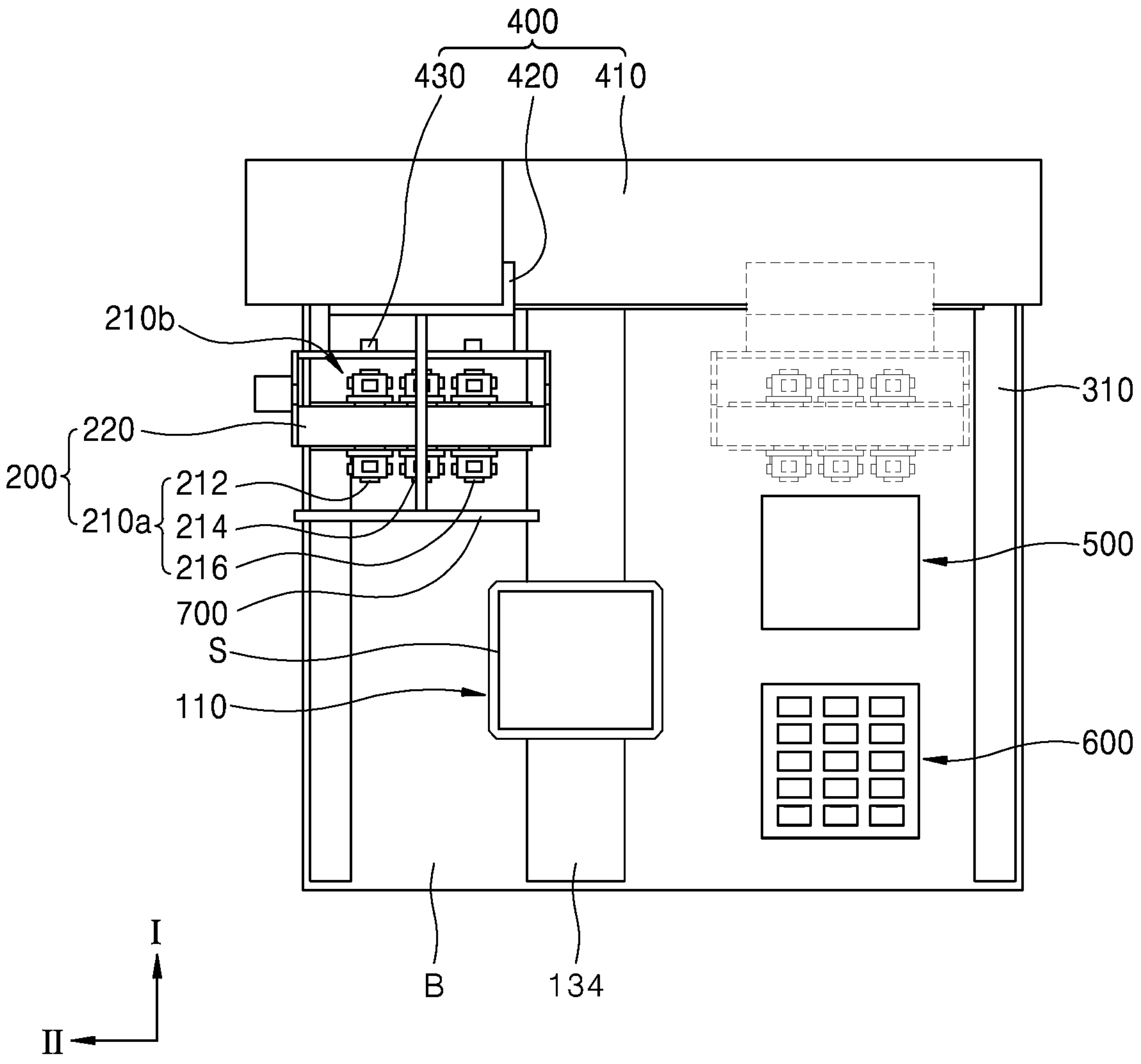
FIG. 3 is a plan view showing the apparatus for dispensing treatment liquid of FIG. 2.

FIG. 2 is a perspective view showing the apparatus 10 for dispensing treatment liquid of FIG. 1, and FIG. 3 is a plan view showing the apparatus 10 for dispensing treatment liquid of FIG. 2.

As shown in FIGS. 2 and 3, the apparatus 10 for dispensing treatment liquid may include a substrate support unit 100, a head unit 200, moving units 300 and 400, head cleaning units 500 and 600, and a three-dimensional (3D) measurement device 700.

The substrate support unit 100 may have a support plate 100 on which a substrate S is placed. The support plate 110 may be a rectangular-shaped plate. A rotary shaft of a rotary drive motor 120 may be connected to a lower surface of the support plate 110. The rotary drive motor 120 may rotate the support plate 110 so that the substrate S placed on the support plate 110 is aligned to a preset position.

The support plate 110 and the rotary drive motor 120 may be rectilinearly moved in the first direction I by a linear drive member 130. The linear drive member 130 may include a slider 132 and a guide member 134. The rotary drive motor 120 may be installed on an upper surface of the slider 132. The guide member 134 is elongated in the first direction I on the central portion of the upper surface of a base B. A linear motor (not shown) may be provided in the slider 132, and the slider 132 may rectilinearly move in the first direction I along the guide member 134.

The head unit 200 may dispense treatment liquid onto the substrate S. The head unit 200 may include inkjet heads 210*a* and 210*b* and a bracket 220. One of the inkjet heads 210*a* and 210*b* may be installed on one side of the bracket 220 facing in the first direction I and the other may be installed on the other side of the bracket 220 facing in the first direction I.

Each of the inkjet heads 210*a* and 210*b* may have a red (R) head 212, a green (G) head 214, and a blue (B) head 216.

The R head 212, the G head 214, and the B head 216 may be arranged in a line in the second direction II, and may dispense the treatment liquid onto the substrate S placed on the substrate 111 by an inkjet method of ejecting droplets.

The moving units 300 and 400 may move the head unit 200 rectilinearly on top of a path along which the support plate 110 moves. A first moving unit 300 may rectilinearly move the head unit 200 in the first direction I, and a second moving unit 400 may rectilinearly move the head unit 200 in the second direction II and third direction III.

The second moving unit 400 may include a horizontal support table 410, a slider 420, and a lifting device 430. The horizontal support table 410 may be located above the base B such that its longitudinal direction faces in the second direction II. A guide rail 412 may be provided along the longitudinal direction of the horizontal support table 410. A linear motor (not shown) may be provided in the slider 420, and the slider 420 may rectilinearly move along the guide rail 412 in the second direction II. The bracket 220 of the head unit 200 may be connected to the slider 420, and the rectilinear movement of the slider 420 may allow the inkjet heads 210*a* and 210*b* installed on the bracket 220 to move in the second direction II. Meanwhile, an elevating device 430 for linearly moving the bracket 220 of the head unit 200 in the third direction (III) may be installed on the slider 420.

The first moving unit 300 may include guide rails 310 and sliders 320. The guide rails 310 may have a longitudinal direction facing in the first direction I, and may each be disposed on both side edges of the upper surface of the base B with respect to the guide member 134. The sliders 320 may be provided with a linear motor (not shown), and may move along the guide rails 310 in the first direction I. Both sides of the horizontal support table 410 of the second moving unit 400 may be connected to the sliders 320, respectively. The rectilinear movement of the sliders 320 may allow the second moving unit 300 including the horizontal support table 410 to move in the first direction I, and the movement of the second moving unit 420 may allow the head unit 200 connected to the second moving unit 400 to rectilinearly move in the second direction II.

The head unit 200 may rectilinearly move in the first direction I, the second direction II, and the third direction III by the first moving unit 300 and the second moving unit 400, and the support plate 110 on which the substrate is placed may rectilinearly move in the first direction I by the slider 132 and the guide member 134. When the treatment liquid is dispensed onto the substrate S, the head unit 200 may be fixed at a preset position and the support plate 110 on which the substrate S is placed may move in the first direction I. Alternatively, the support plate 110 on which the substrate S is placed may be fixed as a preset position and the head unit 200 may move in the first direction I.

The head cleaning unit 500 may periodically clean a treatment liquid dispensing surface of the inkjet heads 210*a* and 210*b*, that is, the surface on which the nozzles for dispensing the treatment liquid are formed. Generally, after a treatment dispensing process for one substrate is performed, cleaning of the treatment liquid dispensing surface of the inkjet heads 210*a* and 210*b* may be performed.

The head cleaning units 500 and 600 may be provided on one side of the substrate support unit 100 on the upper surface of the base B. The inkjet heads 210*a* and 210*b* may be moved above the head cleaning units 500 and 600 by the first moving unit 300 and the second moving unit 400, and may move in the first direction I on top of the head cleaning units 500 and 600 during the cleaning process.

The first head cleaning unit 500 may perform a purging process or a blading process, and the second head cleaning unit 600 may perform the purging process, the blading process, and a blotting process. The purging process, the blading process, and the blotting process may be sequentially performed. The purging process is a process of spraying a portion of the treatment liquid contained in the inkjet heads 210*a* and 210*b* at high pressure. The blading process is a process of removing the treatment liquid remaining on the treatment liquid dispensing surface of the inkjet heads 210*a* and 210*b* in a non-contact manner after the purging process. The blotting process is a process of removing the treatment liquid remaining on the treatment liquid dispensing surface of the inkjet heads 210*a* and 210*b* in a contact manner after the blading process. However, the head cleaning units 500 and 600 are not necessarily limited to the above examples and any cleaning units of various methods may be used.

The 3D measurement device 700, which is a device for three-dimensionally measuring the substrate S seated on the substrate support unit 100, may be fixed to the head unit 200 or fixed in the vicinity of the head unit 200 and be moved along with the head unit 200 by the moving units 300 and 400.

Figure 4:
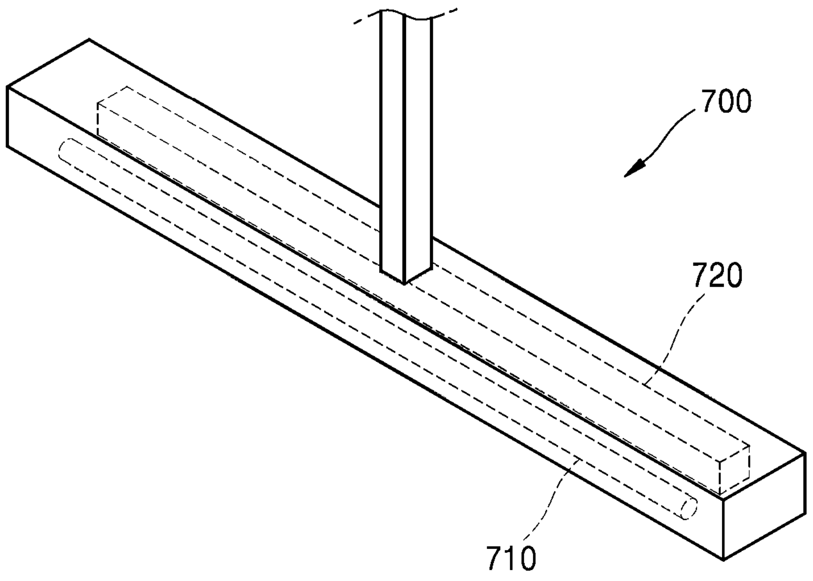
FIG. 4 is an enlarged perspective view showing a three-dimensional (3D) measurement device of the apparatus for dispensing treatment liquid of FIG. 2.
Figure 5:
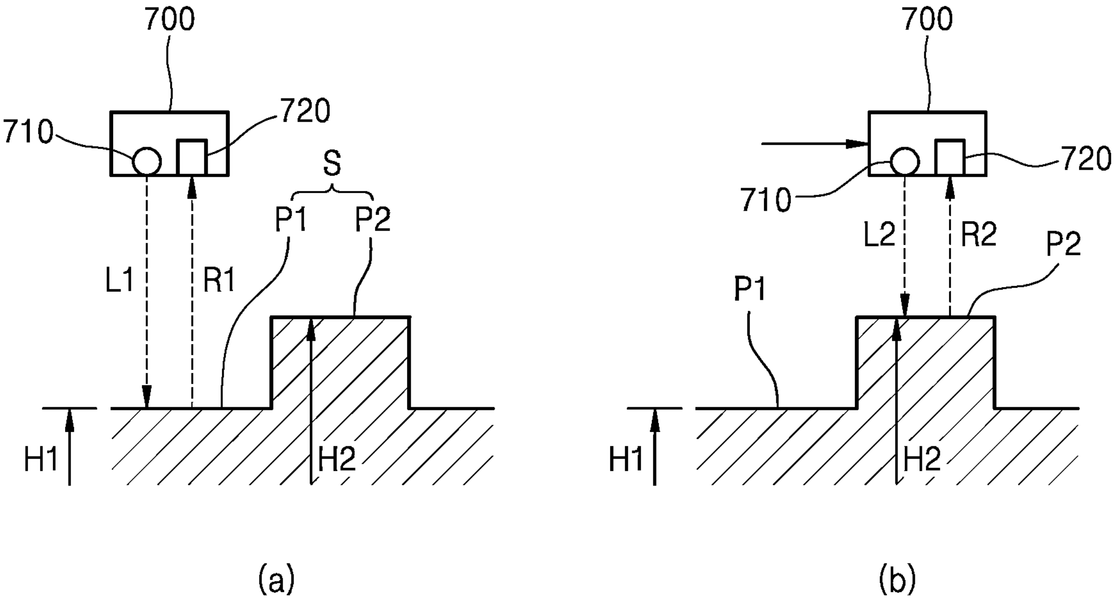
FIG. 5 is a conceptual view showing a substrate measurement state of the 3D measurement device of FIG. 4.
Figure 6:
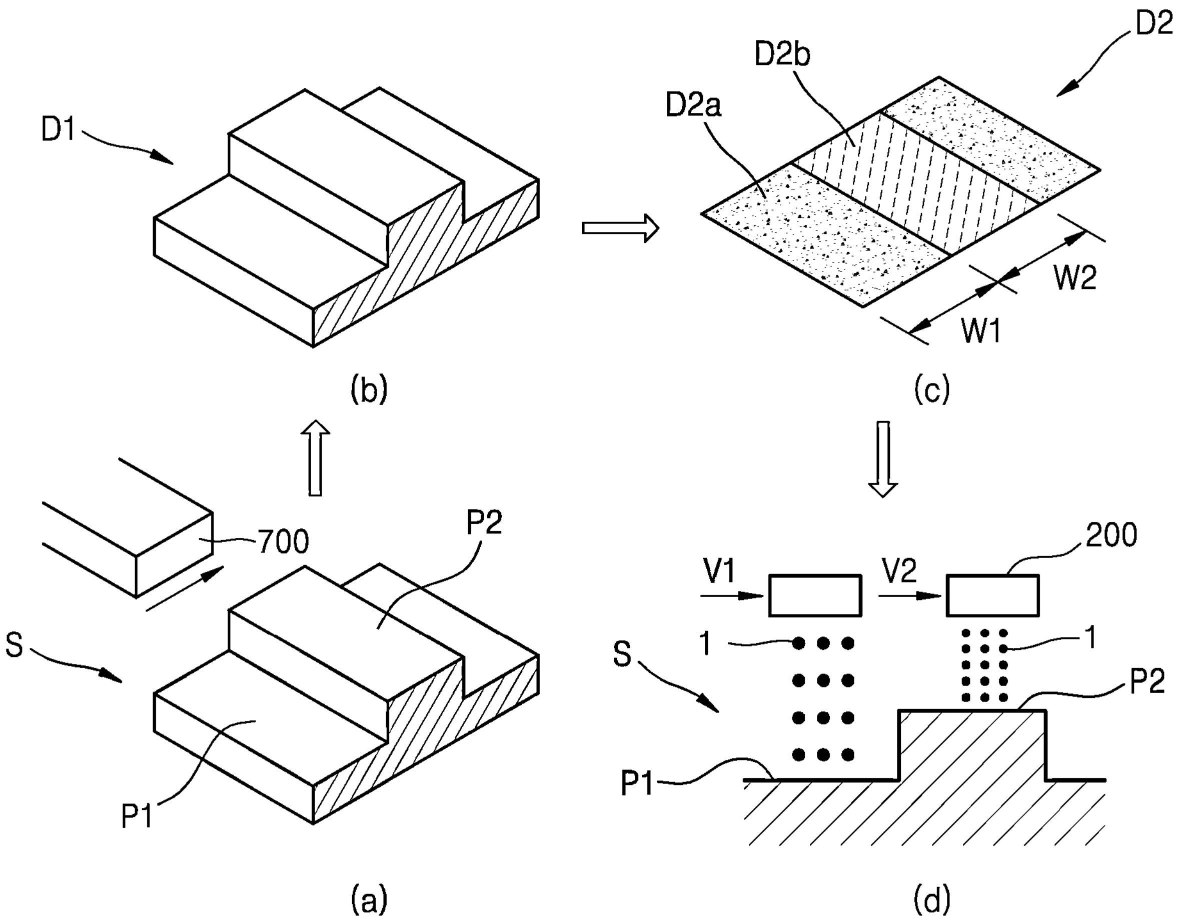
FIG. 6 illustrates views showing an example of a data processing process using the apparatus for dispensing treatment liquid of FIG. 2.

FIG. 4 is an enlarged perspective view showing the 3D measurement device 700 of the apparatus 10 for dispensing treatment liquid of FIG. 2, FIG. 5 is a conceptual view showing a substrate measurement state of the 3D measurement device 700, and FIG. 6 illustrates views showing an example of a data processing process using the apparatus 10 for dispensing treatment liquid of FIG. 2.

As shown in FIG. 4, the 3D measurement device 700 may be a bar-type scanning device having a bar-type light emitting part 710 and a bar-type light receiving part 720. However, the 3D measurement device 700 is not necessarily limited to the drawings, and any types of non-contact 3D measurement devices capable of measuring a depth of a 3D surface may be used. Examples of the non-contact 3D measurement devices may include a camera-type, various image sensor-types, a spectrum measurement device, an infrared distance sensor, a laser level sensor, and the like, in addition to the bar-type scanning device.

Here, as shown in FIGS. 1 to 4, the first moving unit 300 may move the head unit 200 and the 3D measurement device 700 in the first direction, and the second moving unit 400 may move the head unit 200 and the 3D measurement device 700 in the second direction.

However, the moving units 300 and 400 which move the head unit 200 are not necessarily limited to the drawings, and separate moving units that separately move only the 3D measurement device 700 may be additionally installed.

As shown in FIG. 5, more specifically, the 3D measurement device 700 may be an optical measurement device that emits a first incident light L1 to a first portion P1 having a first height H1, formed on the substrate S, and analyzes the characteristics of a first reflected light R1 produced at the first portion P1 to obtain actually measured 3D substrate information D1 of the first portion P1 as shown in FIG. 6, then emits a second incident light L2 to a second portion P2 having a second height H2 different from the first height H1, formed on the substrate S, and analyzes the characteristics of a second reflected light R2 produced at the second portion P2 to obtain the actually measured 3D substrate information D1 of the second portion P2 as shown in FIG. 6.

Therefore, as shown in FIG. 6, in the information processing process using the 3D measurement device 700, when, as shown in (a) of FIG. 6, the 3D measurement device 700 emits the first incident light L1 to the first portion P1 having the first height H1, formed on the substrate S, and then emits the second incident light L2 to the second portion P2 having the second height H2 different from the first height H1, formed on the substrate S, the controller 70 of FIG. 1 may analyze the characteristics of the first reflected light R1 and the second reflected light R2 produced at the first portion P1 and the second portion P2 to generate the actually measured 3D substrate information D1 of the first portion P1 and the second portion P2 as shown in (b) of FIG. 6.

Subsequently, as shown in (c) of FIG. 6, printing pattern image information D2 may be generated based on the actually measured 3D substrate information D1.

In this case, the printing pattern image information D2 may be information finely adjusted to enable accurate printing by reflecting inkjet printing characteristics based on the actually measured 3D substrate information D1.

For example, the controller 70 may adjust a first partial printing portion D2*a* of the printing pattern image information D2 that corresponds to the first portion P1 to a first dispensing amount according to the first height H1 and may adjust a second partial printing portion D2*b* of the printing pattern image information D2 that corresponds to the second portion P2 to a second dispensing amount according to the second height H2.

In addition, for example, as shown in (c) of FIG. 6, the controller 70 may adjust the first partial printing portion D2*a* of the printing pattern image information D2 that corresponds to the first portion P1 to a first width W1 according to the first height H1 and may adjust the second partial printing portion D2*b* of the printing pattern image information D2 that corresponds to the second portion P2 to a second width W2 according to the second height H2.

Therefore, in this way, according to the printing pattern image information D2 adjusted based on the 3D information, printing command information in which the printing width, the printing dispensing amount, and the like are adjusted may be applied to the head unit 200.

In addition, for example, as shown in (d) of FIG. 6, the controller 70 may adjust the first partial printing portion D2*a* of the printing pattern image information D2 that corresponds to the first portion P1 to a first head movement speed V1 according to the first height H1 and may adjust the second partial printing portion D2*b* of the printing pattern image information D2 that corresponds to the second portion P2 to a second head movement speed V2 according to the second height H2.

Accordingly, as shown in FIG. 6, it is possible to prevent printing defects by receiving the actually measured 3D substrate information D1 of the substrate S for accurately identifying the flatness of an underlying film, the depth and shape of a structure, etc. from the 3D measurement device 700 capable of actually measuring the substrate S, generating the printing pattern image information D2 adjusted based on the actually measured 3D substrate information D1, and applying highly accurate and precise printing command information to the head unit 200 according to the generated printing pattern image information D2, and to reduce operation time and cost due to no need for skilled technicians or CAD programs.

Figure 7:
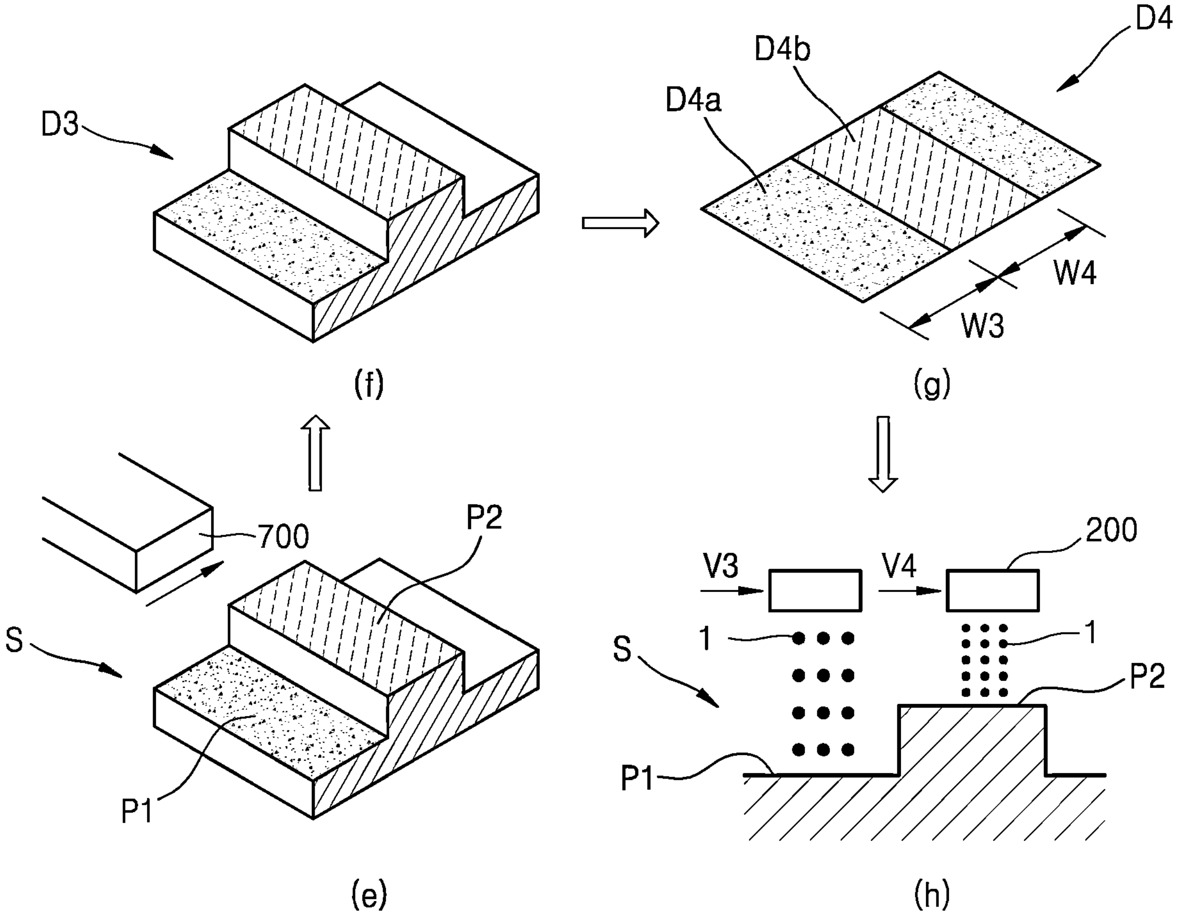
FIG. 7 illustrates views showing another example of a data processing process using the apparatus for dispensing treatment liquid of FIG. 2.

FIG. 7 illustrates views showing another example of a data processing process using the apparatus 10 for dispensing treatment liquid of FIG. 2.

As shown in (e) of FIG. 7, after the printing process is completed as shown in (d) of FIG. 6, the 3D measurement device 700 may re-measure the resulting substrate S.

That is, as shown in (e) of FIG. 7, the controller 70 may apply a measurement control signal to the 3D measurement device 700 to measure the substrate S on which printing has been performed, and the 3D measurement device 700 may three-dimensionally measure the printed surface of the substrate S.

Subsequently, as shown in (f) of FIG. 7, 3D printing result information D3 of the substrate S may be received from the 3D measurement device 700, and whether an actual state of printing is normal or abnormal may be determined based on the 3D printing result information D3.

Then, if the state of the printed substrate S is abnormal, as shown in (g) of FIG. 7, printing pattern correction information D4 may be generated by correcting the printing pattern image information D2 of FIG. 6 based on the 3D printing result information D3.

Next, the controller 70 may adjust a first partial printing portion D4*a* of the printing pattern correction information D4 that corresponds to the first portion P1 to a third dispensing amount according to the first height H1 and may further adjust a second partial printing portion D4*b* of the printing pattern correction information D4 that corresponds to the second portion P2 to the second dispensing amount according to the second height H2.

In addition, for example, as shown in (g) of FIG. 7, the controller 70 may adjust the first partial printing portion D4*a* of the printing pattern correction information D4 that corresponds to the first portion P1 to a third width W3 according to the first height H1 and may further adjust the second partial printing portion D4*b* of the printing pattern correction information D4 that corresponds to the second portion P2 to a fourth width W4 according to the second height H2.

Therefore, in this way, according to the printing pattern image information D2 adjusted based on the 3D information, printing command information in which the printing width, the printing dispensing amount, and the like are adjusted may be applied to the head unit 200.

In addition, for example, as shown in (h) of FIG. 7, the controller 70 may adjust the first partial printing portion D4*a* of the printing pattern correction information D4 that corresponds to the first portion P1 to a third head movement speed V3 according to the first height H1 and may adjust the second partial printing portion D4*b* of the printing pattern correction information D4 that corresponds to the second portion P2 to a fourth head movement speed V4 according to the second height H2.

Therefore, as shown in FIG. 6, it is possible to fundamentally prevent printing defects by receiving the actually measured 3D substrate information D1 of the substrate S for accurately identifying the flatness of an underlying film, the depth and shape of a structure, etc. and the 3D printing resulting information D3 from the 3D measurement device 700 capable of actually measuring not only the substrate S but also the printed substrate S, generating the printing pattern correction information D4 further adjusted based on the actually measured 3D substrate information D1 and the 3D printing result information D3, and applying highly accurate and precise printing command information to the head unit 200 according to the generated printing pattern correction information D4.

Figure 8:
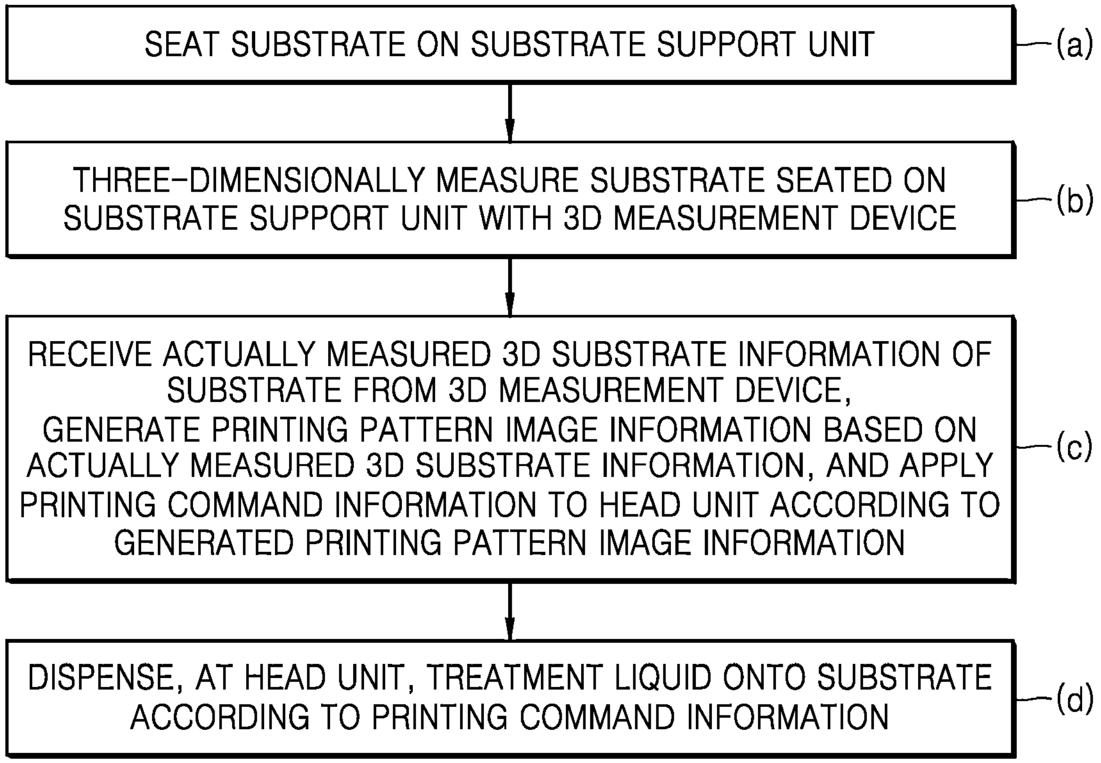
FIG. 8 is a flowchart illustrating a method of dispensing treatment liquid according to some embodiments of the present invention.

FIG. 8 is a flowchart illustrating a method of dispensing treatment liquid according to some embodiments of the present invention.

As shown in FIGS. 1 to 8, a method of dispensing treatment liquid according to some embodiments of the present invention may include: (a) seating the substrate S on the substrate support unit 100; (b) three-dimensionally measuring, by the 3D measurement device 700, the substrate S seated on the substrate support unit 100; (c) receiving, at the controller 70, actually measured 3D substrate information D1 of the substrate S from the 3D measurement device 700, generating printing pattern image information D2 based on the actually measured 3D substrate information D1, and applying printing command information to the head unit 200 according to the generated printing pattern image information D2; and (d) dispensing, at the head unit 200, treatment liquid 1 onto the substrate S according to the printing command information.

Here, for example, in operation (b), a first moving unit 300 may move the head unit 200 in a first direction I and a second moving unit 400 may move the head unit 200 in a second direction II.

In addition, for example, in operation (c), the controller 70 may adjust a first partial printing portion D2*a* of the printing pattern image information D2 that corresponds to the first portion P1 to a first dispensing amount according to the first height H1 and may adjust a second partial printing portion D2*b* of the printing pattern image information D2 that corresponds to the second portion P2 to a second dispensing amount according to the second height H2.

Also, for example, in operation (c), the controller 70 may adjust the first partial printing portion D2*a* of the printing pattern image information D2 that corresponds to the first portion P1 to a first width W1 according to the first height H1 and may adjust the second partial printing portion D2*b* of the printing pattern image information D2 that corresponds to the second portion P2 to a second width W2 according to the second height H2.

Moreover, for example, in operation (c), the controller 70 may adjust the first partial printing portion D2*a* of the printing pattern image information D2 that corresponds to the first portion P1 to a first head movement speed according to the first height H1 and may adjust the second partial printing portion D2*b* of the printing pattern image information D2 that corresponds to the second portion P2 to a second head movement speed according to the second height H2.

Furthermore, for example, in operation (d), the first moving unit 300 may move the 3D measurement device 700 in the first direction I, and the second moving unit 400 may move the 3D measurement device 700 in the second direction II.

Figure 9:
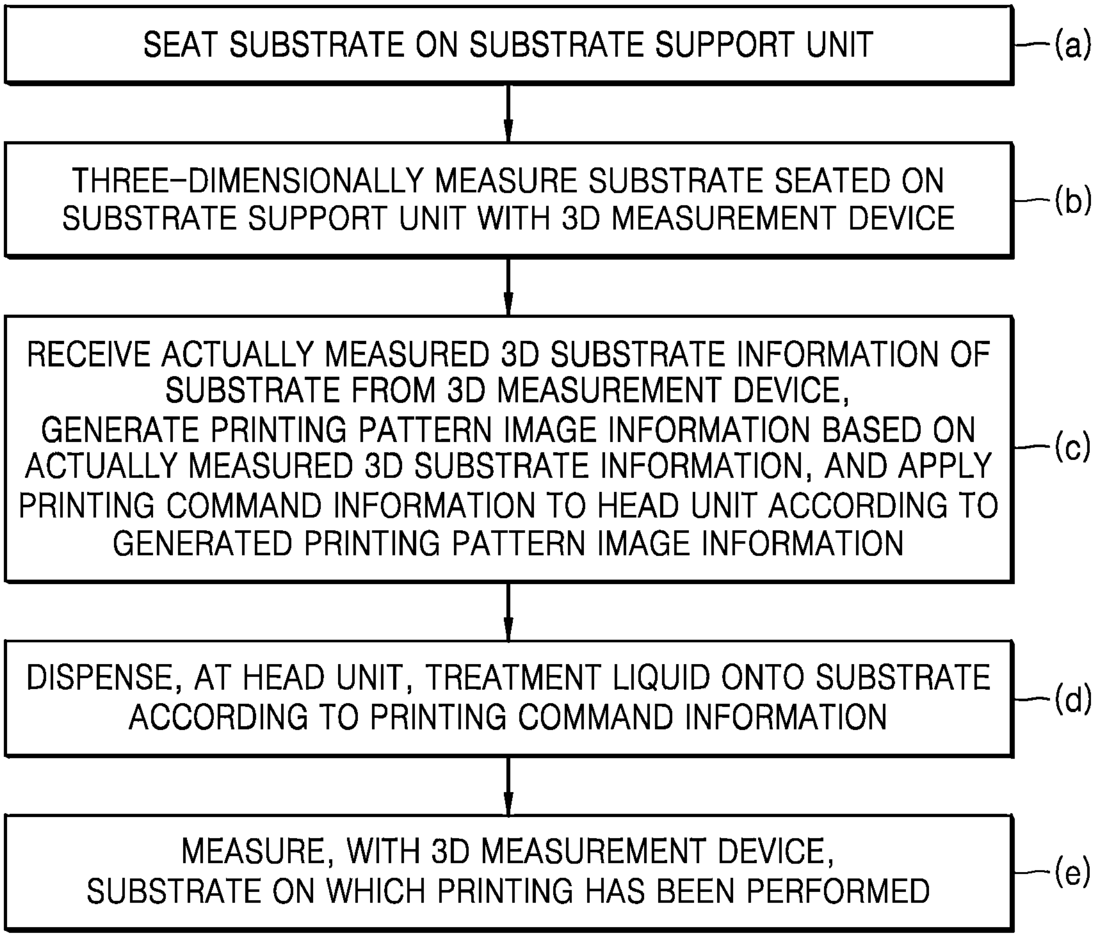
FIG. 9 is a flowchart illustrating a method of dispensing treatment liquid according to some other embodiments of the present invention.

FIG. 9 is a flowchart illustrating a method of dispensing treatment liquid according to some other embodiments of the present invention.

As shown in FIGS. 1 to 9, a method of dispensing treatment liquid according to some other embodiments of the present invention may include: (a) seating the substrate S on the substrate support unit 100; (b) three-dimensionally measuring, by the 3D measurement device 700, the substrate S seated on the substrate support unit 100; (c) receiving, at the controller 70, actually measured 3D substrate information D1 of the substrate S from the 3D measurement device 700, generating printing pattern image information D2 based on the actually measured 3D substrate information D1, and applying printing command information to the head unit 200 according to the generated printing pattern image information D2; (d) dispensing, at the head unit 200, treatment liquid 1 onto the substrate S according to the printing command information; and (e) measuring, by the 3D measurement device 700, the substrate S on which printing has been performed.

Figure 10:
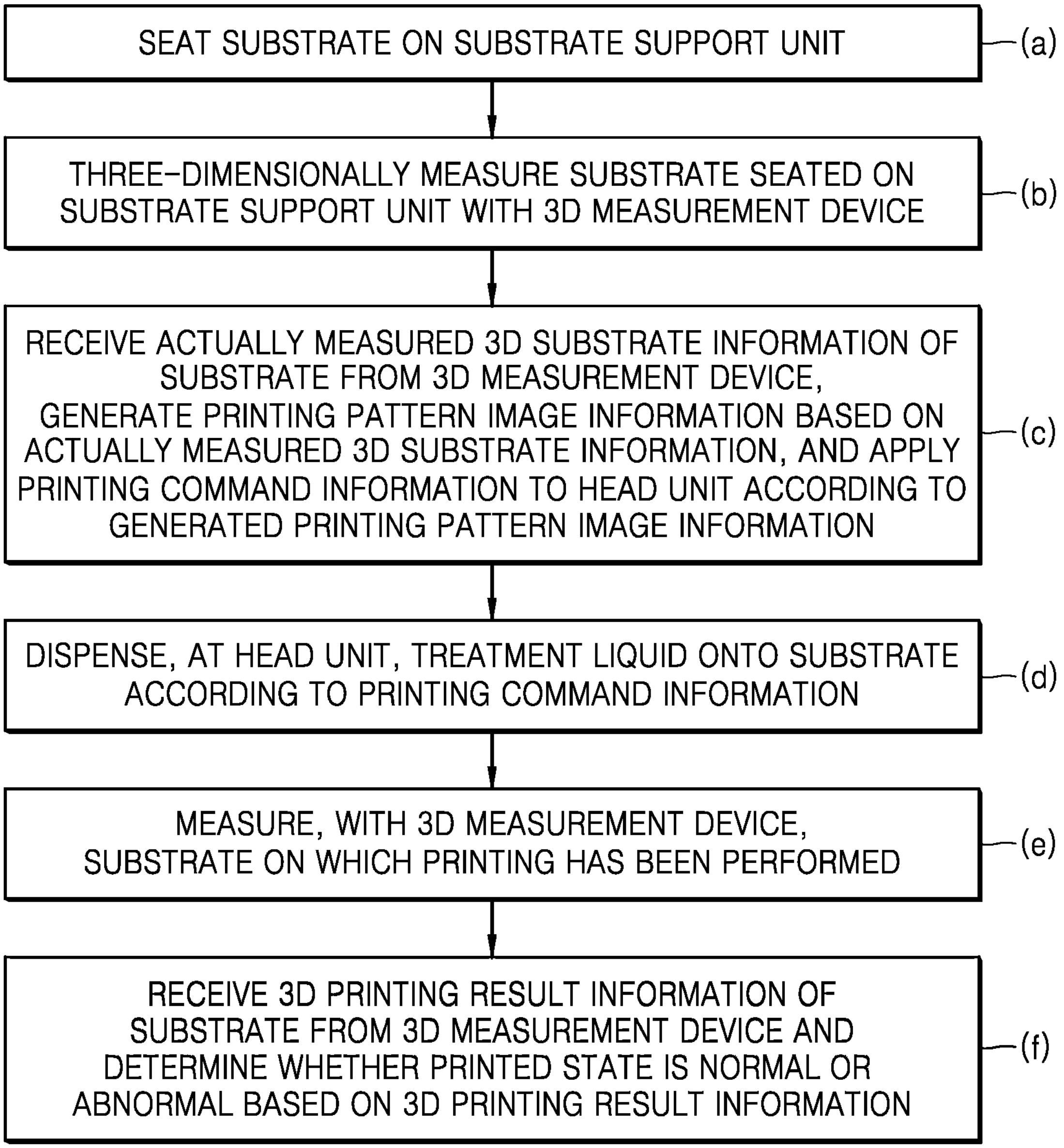
FIG. 10 is a flowchart illustrating a method of dispensing treatment liquid according to still some other embodiments of the present invention.

FIG. 10 is a flowchart illustrating a method of dispensing treatment liquid according to still some other embodiments of the present invention.

As shown in FIGS. 1 to 10, a method of dispensing treatment liquid according to still some embodiments of the present invention may include: (a) seating the substrate S on the substrate support unit 100; (b) three-dimensionally measuring, by the 3D measurement device 700, the substrate S seated on the substrate support unit 100; (c) receiving, at the controller 70, actually measured 3D substrate information D1 of the substrate S from the 3D measurement device 700, generating printing pattern image information D2 based on the actually measured 3D substrate information D1, and applying printing command information to the head unit 200 according to the generated printing pattern image information D2; (d) dispensing, at the head unit 200, treatment liquid 1 onto the substrate S according to the printing command information; (e) measuring, by the 3D measurement device 700, the substrate S on which printing has been performed; and (f) receiving, at the controller 70, 3D printing result information D3 of the substrate S from the 3D measurement device 700 and determining whether a printed state is normal or abnormal based on the 3D printing result information D3.

Figure 11:
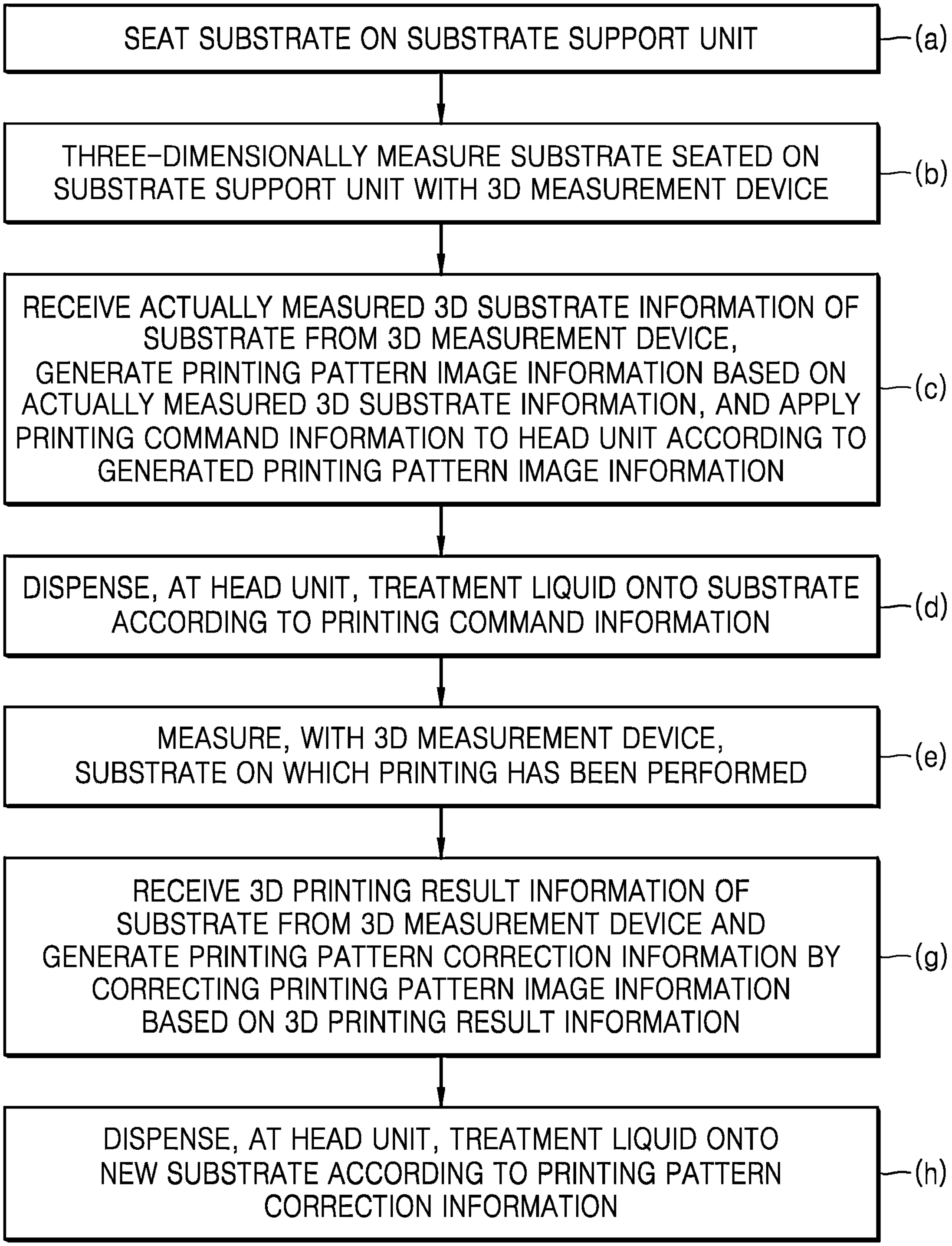
FIG. 11 is a flowchart illustrating a method of dispensing treatment liquid according to yet some other embodiments of the present invention.

FIG. 11 is a flowchart illustrating a method of dispensing treatment liquid according to yet some other embodiments of the present invention.

As shown in FIGS. 1 to 11, a method of dispensing treatment liquid according to yet some other embodiments of the present invention may include: (a) seating the substrate S on the substrate support unit 100; (b) three-dimensionally measuring, by the 3D measurement device 700, the substrate S seated on the substrate support unit 100; (c) receiving, at the controller 70, actually measured 3D substrate information D1 of the substrate S from the 3D measurement device 700, generating printing pattern image information D2 based on the actually measured 3D substrate information D1, and applying printing command information to the head unit 200 according to the generated printing pattern image information D2; (d) dispensing, at the head unit 200, treatment liquid 1 onto the substrate S according to the printing command information; (e) measuring, by the 3D measurement device 700, the substrate S on which printing has been performed; (g) receiving, at the controller 70, 3D printing result information D3 of the substrate S from the 3D measurement device 700 and generating printing pattern correction information D4 by correcting the printing pattern image information D2 based on the 3D printing result information D3; and (h) dispensing, at the head unit 200, the treatment liquid 1 onto a new substrate S according to the printing pattern correction information D4.

According to various embodiments of the present invention, printing defects may be prevented by receiving actually measured 3D substrate information of a substrate for accurately identifying the flatness of an underlying film, a depth and shape of a structure, etc. from a 3D measurement device capable of actually measuring the substrate, generating printing pattern image information based on the actually measured 3D substrate information, and applying a highly accurate and precise printing command to a head unit according to the generated printing pattern image information, operation time and cost may be reduced due to no need for skilled technicians or CAD programs, and the precision and performance of a device may be further improved by re-inspecting the printed substrate with a 3D measurement device to determine whether the substrate is normal or abnormal or generating printing pattern correcting information by correcting printing pattern image information. However, the scope of the present disclosure is not limited by the above effect.

While the present invention has been particularly shown and described with reference to embodiments thereof, it will be understood by those of ordinary skill in the art that various changes in form and details may be made therein without departing from the spirit and scope of the present invention as defined by the following claims.

REFERENCE NUMERALS

S: SUBSTRATE
10: APPARATUS FOR DISPENSING TREATMENT LIQUID
100: SUBSTRATE SUPPORT UNIT
200: HEAD UNIT
300: FIRST MOVING UNIT
400: SECOND MOVING UNIT
430: LIFTING DEVICE
500: FIRST HEAD CLEANING UNIT
600: SECOND HEAD CLEANING UNIT
700: 3D MEASUREMENT DEVICE
1: TREATMENT LIQUID
D1: ACTUALLY MEASURED 3D SUBSTRATE INFORMATION
D2: PRINTING PATTERN IMAGE INFORMATION
D2A: FIRST PARTIAL PRINTING PORTION
D2B: SECOND PARTIAL PRINTING PORTION
H1: FIRST HEIGHT
H2: SECOND HEIGHT
P1: FIRST PORTION
P2: SECOND PORTION
L1: FIRST INCIDENT LIGHT
R1: FIRST REFLECTED LIGHT
L2: SECOND INCIDENT LIGHT
R2: SECOND REFLECTED LIGHT
W1: FIRST WIDTH
W2: SECOND WIDTH
V1: FIRST HEAD MOVEMENT SPEED
V2: SECOND HEAD MOVEMENT SPEED
D3: 3D PRINTING RESULT INFORMATION
D4: PRINTING PATTERN CORRECTION INFORMATION
1000: TREATMENT LIQUID APPLICATION FACILITY

What is claimed is:

1. An apparatus for dispensing treatment liquid, comprising:

a substrate support configured to hold a substrate;

a three-dimensional measurement device configured to three-dimensionally measure the substrate on the substrate support;

a head unit configured to dispense treatment liquid onto the substrate seated on the substrate support; and a controller configured to receive measured three-dimensional substrate information of the substrate from the three-dimensional measurement device, generate printing pattern image information based on the measured three-dimensional substrate information, and apply printing command information to the head unit according to the generated printing pattern image information, the controller being configured to adjust a head movement speed of the head unit, based on the printing command information, as the head unit is dispensing the treatment liquid.

2. The apparatus of claim 1, wherein the three-dimensional measurement device is an optical measurement device configured to emit a first incident light to a first portion having a first height, formed on the substrate, and analyze characteristics of a first reflected light produced at the first portion to obtain actually measured three-dimensional substrate information of the first portion and emit a second incident light to a second portion having a second height different from the first height, formed on the substrate, and analyze characteristics of a second reflected light produced at the second portion to obtain the actually measured three-dimensional substrate information of the second portion.

3. The apparatus of claim 2, wherein the controller is configured to adjust a first partial printing portion of the printing pattern image information that corresponds to the first portion to a first dispensing amount according to the first height and adjusts a second partial printing portion of the printing pattern image information that corresponds to the second portion to a second dispensing amount according to the second height.

4. The apparatus of claim 2, wherein the controller is configured to adjust a first partial printing portion of the printing pattern image information that corresponds to the first portion to a first width according to the first height and adjusts a second partial printing portion of the printing pattern image information that corresponds to the second portion to a second width according to the second height.

5. The apparatus of claim 2, wherein the controller is configured to adjust the head movement speed by first adjusting a first partial printing portion of the printing pattern image information that corresponds to the first portion to a first head movement speed according to the first height and second adjusting a second partial printing portion of the printing pattern image information that corresponds to the second portion to a second head movement speed according to the second height.

6. The apparatus of claim 1, wherein the three-dimensional measurement device is a bar-type scanning device having a bar-type light emitting part and a bar-type light-receiving part.

7. The apparatus of claim 1, wherein the three-dimensional measurement device is fixed to the head unit or fixed in near the head unit and may move along with the head unit.

8. The apparatus of claim 1, wherein the controller is configured to apply a measurement control signal to the three-dimensional measurement device to enable the three-dimensional measurement device to measure the substrate on which printing has been performed, receives three-dimensional printing result information of the substrate from the three-dimensional measurement device, and determines whether a printed state is normal or abnormal based on the three-dimensional printing result information.

9. The apparatus of claim 1, wherein the controller is configured to apply a measurement control signal to the three-dimensional measurement device to enable the three-dimensional measurement device to measure the substrate on which printing has been performed, receives three-dimensional printing result information of the substrate from the three-dimensional measurement device, and generates printing pattern correction information by correcting the printing pattern image information based on the three-dimensional printing result information.

10. The apparatus of claim 1, further comprising:

a first moving unit configured to move the head unit and the three-dimensional measurement device in a first direction; and a second moving unit configured to move the head unit and the three-dimensional measurement device in a second direction.

11. A method of dispensing treatment liquid, comprising:

seating a substrate on a substrate support;

measuring, by a three-dimensional measurement device, the substrate seated on the substrate support;

first receiving, at a controller, measured three-dimensional substrate information of the substrate from the three-dimensional measurement device, generating printing pattern image information based on the measured three-dimensional substrate information, and applying printing command information to a head unit according to the generated printing pattern image information; and first dispensing, at the head unit, treatment liquid onto the substrate according to the printing command information, the first dispensing including adjusting, by the controller, a head movement speed of the head unit, based on the printing command information, as the head unit is dispensing the treatment liquid.

12. The method of claim 11, wherein the first dispensing includes adjusting, by the controller, a first partial printing portion of the printing pattern image information that corresponds to a first portion to a first dispensing amount according to a first height and adjusting a second partial printing portion of the printing pattern image information that corresponds to a second portion to a second dispensing amount according to a second height.

13. The method of claim 11, wherein the first dispensing includes adjusting, by the controller, a first partial printing portion of the printing pattern image information that corresponds to a first portion to a first width according to a first height and adjusting a second partial printing portion of the printing pattern image information that corresponds to a second portion to a second width according to a second height.

14. The method of claim 11, wherein the first dispensing includes adjusting, by the controller, a first partial printing portion of the printing pattern image information that corresponds to a first portion to a first head movement speed according to a first height and adjusts a second partial printing portion of the printing pattern image information that corresponds to a second portion to a second head movement speed according to a second height.

15. The method of claim 11, further comprising:

measuring, by the three-dimensional measurement device, the substrate on which printing has been performed, the measuring occurring after the first dispensing.

16. The method of claim 15, further comprising:

second receiving, at the controller, three-dimensional printing result information of the substrate from the three-dimensional measurement device and determining whether a printed state is normal or abnormal based on the three-dimensional printing result information, the second receiving occurring after the first receiving.

17. The method of claim 15, further comprising:

second receiving, at the controller, three-dimensional printing result information of the substrate from the three-dimensional measurement device and generating printing pattern correction information by correcting the printing pattern image information based on the three-dimensional printing result information; and second dispensing, at the head unit, the treatment liquid onto a new substrate according to the printing pattern correction information.

18. The method of claim 11, wherein the measuring measures such that a first moving unit moves the head unit in a first direction and a second moving unit moves the head unit in a second direction.

19. The method of claim 18, wherein the first dispensing dispenses such that the first moving unit moves the three-dimensional measurement device in the first direction and the second moving unit moves the three-dimensional measurement device in the second direction.

20. An apparatus for dispensing treatment liquid, comprising:

a substrate support configured to hold a substrate;

a three-dimensional measurement device configured to three-dimensionally measure the substrate on the substrate support;

a head unit configured to dispense treatment liquid onto the substrate seated on the substrate support;

a first moving unit configured to move the head unit and the three-dimensional measurement device in a first direction;

a second moving unit configured to move the head unit and the three-dimensional measurement device in a second direction; and a controller configured to receive measured three-dimensional substrate information of the substrate from the three-dimensional measurement device, generate printing pattern image information based on the measured three-dimensional substrate information, and apply printing command information to the head unit according to the generated printing pattern image information, the controller being configured to adjust a head movement speed of the head unit, based on printing command information, as the head unit is dispensing the treatment liquid, wherein the three-dimensional measurement device is an optical measurement device configured to emit a first incident light to a first portion having a first height, formed on the substrate, and analyze characteristics of a first reflected light produced at the first portion to obtain measured three-dimensional substrate information of the first portion and emit a second incident light to a second portion having a second height different from the first height, formed on the substrate, and analyze characteristics of a second reflected light produced at the second portion to obtain the actually measured three-dimensional substrate information of the second portion.

* * * * *